United States Patent
Van De Kerkhof

(10) Patent No.: US 12,276,815 B2
(45) Date of Patent: Apr. 15, 2025

(54) EUV COLLECTOR MIRROR

(71) Applicants: CARL ZEISS SMT GMBH, Oberkochen (DE); ASML NETHERLANDS B.V., Veldhoven (NL)

(72) Inventor: Marcus Van De Kerkhof, Veldhoven (NL)

(73) Assignees: CARL ZEISS SMT GMBH, Oberkochen (DE); ASML NETHERLANDS B.V., Veldhoven (NL)

( * ) Notice: Subject to any disclaimer, the term of this patent is extended or adjusted under 35 U.S.C. 154(b) by 552 days.

(21) Appl. No.: 17/722,028

(22) Filed: Apr. 15, 2022

(65) Prior Publication Data

US 2022/0236461 A1    Jul. 28, 2022

Related U.S. Application Data

(63) Continuation of application No. PCT/EP2020/075493, filed on Sep. 11, 2020.

(30) Foreign Application Priority Data

Oct. 15, 2019  (DE) .................. 10 2019 215 829.3

(51) Int. Cl.
*H05G 2/00* (2006.01)
*G02B 5/08* (2006.01)
(Continued)

(52) U.S. Cl.
CPC ............. *G02B 5/0891* (2013.01); *G02B 5/09* (2013.01); *G02B 19/0095* (2013.01); *G03F 7/70316* (2013.01)

(58) Field of Classification Search
CPC ...... G02B 5/0891; G02B 5/09; G02B 5/1861; G02B 19/0095; G02B 7/70316;
(Continued)

(56) References Cited

U.S. PATENT DOCUMENTS 8,724,207 B1 * 5/2014 Andrusyak .......... G02B 5/1861
359/264
10,101,569 B2  10/2018 Bauer
(Continued)

FOREIGN PATENT DOCUMENTS

DE    102009045096 A1    10/2010
DE    102012202675 A1    1/2013
(Continued)

OTHER PUBLICATIONS

Japanese Office Action with English translation, Application No. 2022-522843, Jun. 3, 2024, 8 pages.
(Continued)

*Primary Examiner* — Jason L McCormack
(74) *Attorney, Agent, or Firm* — Edell, Shapiro & Finnan, LLC

(57) ABSTRACT

An EUV collector mirror has a reflection surface (16) to reflect usable EUV light which impinges on the reflection surface (16) from a source region (17) to a subsequent EUV optics. The reflection surface (16) carries a pump light grating structure (19) configured to retroreflect pump light (22) which impinges upon the pump light grating structure (19) from the source region (17) back to the source region (17). The pump light (22) has a wavelength deviating from the wavelength of the usable EUV light. Such EUV collector mirror enables a high conversion efficiency between the energy of pump light of a laser discharged produced plasma (LDPP) EUV light source on the one hand and the resulting usable EUV energy on the other.

12 Claims, 3 Drawing Sheets

(51) Int. Cl.
  *G02B 5/09* (2006.01)
  *G02B 19/00* (2006.01)
  *G03F 7/00* (2006.01)
(58) Field of Classification Search
  CPC ............ G02B 7/70158; G02B 7/70175; G02B 7/70575; G02B 7/70033; H05G 2/00; H05G 2/01; H05G 2/008; G21K 2201/067
  USPC ...................................................... 250/504 R
  See application file for complete search history.

(56) References Cited

U.S. PATENT DOCUMENTS

| | | | |
|---|---|---|---|
| 2009/0289205 A1 | 11/2009 | Moriya et al. | |
| 2014/0118830 A1* | 5/2014 | Mueller | G02B 5/1838 359/572 |
| 2017/0254995 A1* | 9/2017 | Bauer | G02B 19/0023 |
| 2018/0246414 A1* | 8/2018 | Banine | G02B 5/1861 |
| 2019/0094699 A1 | 3/2019 | Schuster et al. | |

FOREIGN PATENT DOCUMENTS

| | | |
|---|---|---|
| DE | 102013002064 A1 | 8/2013 |
| DE | 102016215235 A1 | 6/2017 |
| DE | 102017212417 A1 | 6/2018 |
| DE | 102019200698 A1 | 12/2019 |
| EP | 2533078 A1 | 12/2012 |
| JP | 2014236121 A | 12/2014 |
| TW | 201303382 A | 1/2013 |
| TW | 201802533 A | 1/2018 |
| TW | 201931008 A | 8/2019 |
| WO | 2010095942 A1 | 8/2010 |
| WO | 2012023853 A1 | 2/2012 |
| WO | 2012123436 A1 | 9/2012 |
| WO | 2013113537 A2 | 8/2013 |
| WO | 2016131069 A2 | 8/2016 |
| WO | 2017174423 A1 | 10/2017 |
| WO | 2019129465 A1 | 7/2019 |

OTHER PUBLICATIONS

International Search Report, PCT/EP2020/075493, Dec. 17, 2020, 2 pages.
German Office Action with English translation, Application 10 2019 215 829.3, Jun. 3, 2020, 12 pages.
Taiwan Office Action with English translation, Application No. 109129130, Oct. 20, 2023, 8 pages.

* cited by examiner

EUV COLLECTOR MIRROR

CROSS-REFERENCE TO RELATED APPLICATION

This is a Continuation of International Application PCT/EP2020/075493, which has an international filing date of Sep. 11, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 215 829.3 filed on Oct. 15, 2019.

FIELD OF THE INVENTION

The invention relates to an EUV collector mirror for use in an EUV projection exposure apparatus employing extreme ultraviolet (EUV) light.

BACKGROUND

An illumination optical unit with such a collector is known from DE 10 2013 002 064 A1 and from US 2019/0094699 A1. A collector mirror is known from U.S. Pat. No. 10,101,569 B2. Further EUV collector mirror embodiments are known from DE 10 2019 200 698 A1.

SUMMARY

It is an object of the present invention to develop an EUV collector mirror enabling a higher conversion efficiency between the energy of pump light of a laser discharged produced plasma (LDPP) EUV light source on the one hand and the resulting usable EUV energy on the other.

According to the invention, this object is achieved by an EUV collector mirror comprising the features specified in the independent claims.

According to one formulation of the invention, it has been realized that a grating structure that is configured to retroreflect pump light emanating from a source region of the LDPP source enables a high conversion efficiency from pump light energy into usable EUV light energy. The retroreflective pump light again is used in the source region for conversion to usable EUV light.

In particular, such retroreflecting pump light grating structure on the EUV collector mirror avoids the necessity of a Pre-Pulse/Main Pulse scheme of the pump light source as is known from prior art. This facilitates the construction of the pump light laser source. In particular, it is not necessary to preshape a target of the LDPP source, e.g. a tin droplet, with a Pre-Pulse for increasing the conversion efficiency of the Main Pulse conversion into the usable EUV light. This leads to a cost reduction with respect to the construction of a source collector module including the light source on the one hand and the EUV collector mirror on the other. The effectively used pump light energy as compared with conventional Pre-Pulse/Main Pulse schemes can be increased significantly, e.g. about a number of 50% or even 100%.

In particular, a spherical target can be used to be impinged upon the pump light without the need of specifically further shaping.

The pump light grating structure may be a blazed grating. A blaze angle may be optimized for a $0^{th}$ or for a $+/-1^{st}$ order of retroreflective diffraction of the pump light wavelength. A pitch of the pump light grating structure varies over the rreflection surface of the EUV collector mirror in order to adapt the retroreflective properties to the angle of incidence condition of the pump light rays impinging upon the pump light grating structure.

In case of a reflection surface of the EUV collector mirror being rotationally symmetric with respect to a rotational symmetry axis, the pitch may increase with increasing distance of the grating structures to such symmetry axis or, in another embodiment, the pitch may decrease with increasing distance. In a further embodiment, a dependency between the pitch and such distance of the grating structures to the symmetry axis may be non-monotonic.

The pump light grating structure may include two or more different height levels, i.e. may be realized as a two-step grating or as a multi-step grating.

Pump light wavelengths according to preferred embodiments have been proved to be particularly suitable for efficiently producing usable EUV illumination light.

A pitch, e.g. a grating period, according to preferred embodiments satisfy the retroreflecting conditions for the pump light wavelength. The pitch depends on the angle of incidence of the pump light on the reflection surface. Such angle of incidence depends upon the distance between the impingement point of the respective pump light ray on the reflection surface to an axis of rotational symmetry. As a result, the pitch depends upon the distance of a reflection surface area carrying the pump light grating structure to such axis of symmetry. With increasing distance to the axis of symmetry, the pitch may decrease.

A typical dimension of the pitch may be in the range between 0.1 mm to 2 mm, in particular between 0.2 mm and 1.0 mm, more in particular between 0.5 mm and 0.9 mm.

Reflectivities according to preferred embodiments can be achieved by using a proper pump light grating structure. The reflection surface of the EUV collector mirror may carry a high reflective coating which is optimized mainly for high reflection of the usable EUV illumination light. Such reflective coating also may be optimized for high reflection of the pump light wavelength.

The advantages of a source collector module according to preferred embodiments are those explained above with respect to the EUV collector mirror.

The same holds for a pump light source according to further preferred embodiments.

A pulse duration and/or a pulse rise time according to various preferred embodiment proved to show a particularly high conversion efficiency.

The advantages of an illumination optics, of a projection exposure apparatus, of a production method, and of a micro- and/or nanostructured component as detailed in further embodiments are those which previously were discussed with respect to the EUV collector mirror, the source collector mirror module and the pump light source.

In particular, a semiconductor component, for example a memory chip, may be produced using the projection exposure apparatus.

BRIEF DESCRIPTION OF THE DRAWINGS

An exemplary embodiment of the invention is explained in greater detail below with reference to the drawing. In said drawing shows.

DETAILED DESCRIPTION

Figure 1:
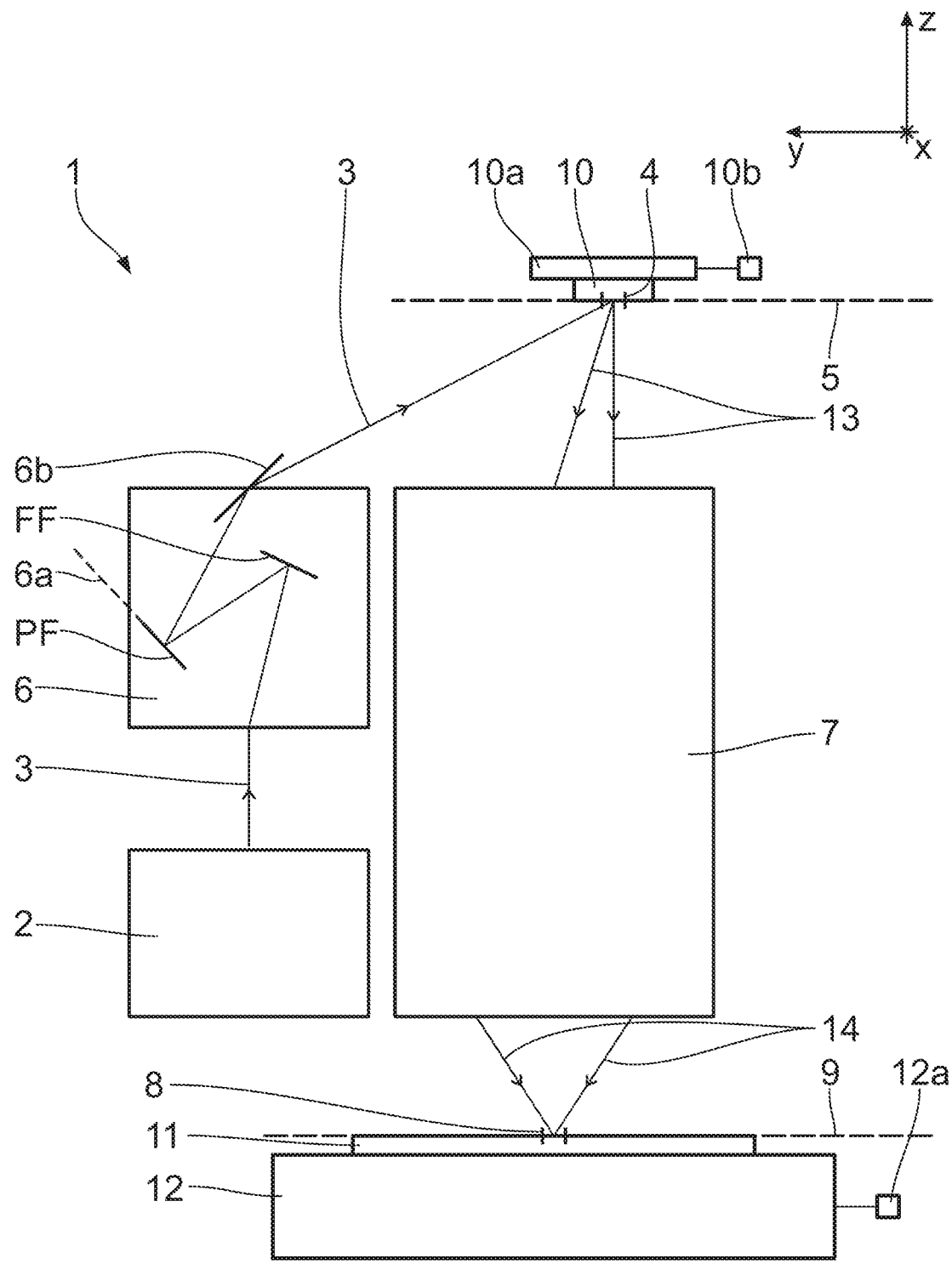
FIG. 1 schematically a projection exposure apparatus for EUV microlithography.

A projection exposure apparatus 1 for microlithography comprises a light source module 2 for EUV illumination light and/or imaging light 3, which will be explained in yet more detail below. Such light source module 2 also is denoted as a source collector module. A light source of the light source module 2 is an EUV light source, which produces light in a wavelength range of e.g. between 5 nm and 30 nm, in particular between 5 nm and 15 nm. The illumination light and/or imaging light 3 is also referred to as used EUV light below.

In particular, the EUV light source may be a light source with a used EUV wavelength of 13.5 nm or a light source with a used EUV wavelength of 6.9 nm or 7 nm. Other used EUV wavelengths are also possible. A beam path of the illumination light 3 is depicted very schematically in FIG. 1.

An illumination optical unit 6 serves to guide the illumination light 3 from the light source to an object field 4 in an object plane 5. Said illumination optical unit comprises a field facet mirror FF depicted very schematically in FIG. 1 and a pupil facet mirror PF disposed downstream in the beam path of the illumination light 3 and likewise depicted very schematically. A field-forming mirror 6b for grazing incidence (GI mirror; grazing incidence mirror) is arranged in the beam path of the illumination light 3 between the pupil facet mirror PF, which is arranged in a pupil plane 6a of the illumination optical unit, and the object field 4. Such a GI mirror 6b is not mandatory.

Pupil facets (not depicted in any more detail) of the pupil facet mirror PF are part of a transfer optical unit, which transfer, and in particular image, field facets (likewise not depicted) of the field facet mirror FF into the object field 4 in a manner superposed on one another. An embodiment known from the prior art may be used for the field facet mirror FF on the one hand and the pupil facet mirror PF on the other hand. By way of example, such an illumination optical unit is known from DE 10 2009 045 096 A1.

Using a projection optical unit or imaging optical unit 7, the object field 4 is imaged into an image field 8 in an image plane 9 with a predetermined reduction scale. Projection optical units which may be used to this end are known from e.g. DE 10 2012 202 675 A1.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction extends to the left in FIG. 1 and the z-direction extends upward in FIG. 1. The object plane 5 extends parallel to the xy-plane.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments known from the prior art may be used for the projection optical unit 7. What is imaged in this case as an object is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into said projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

Figure 2:
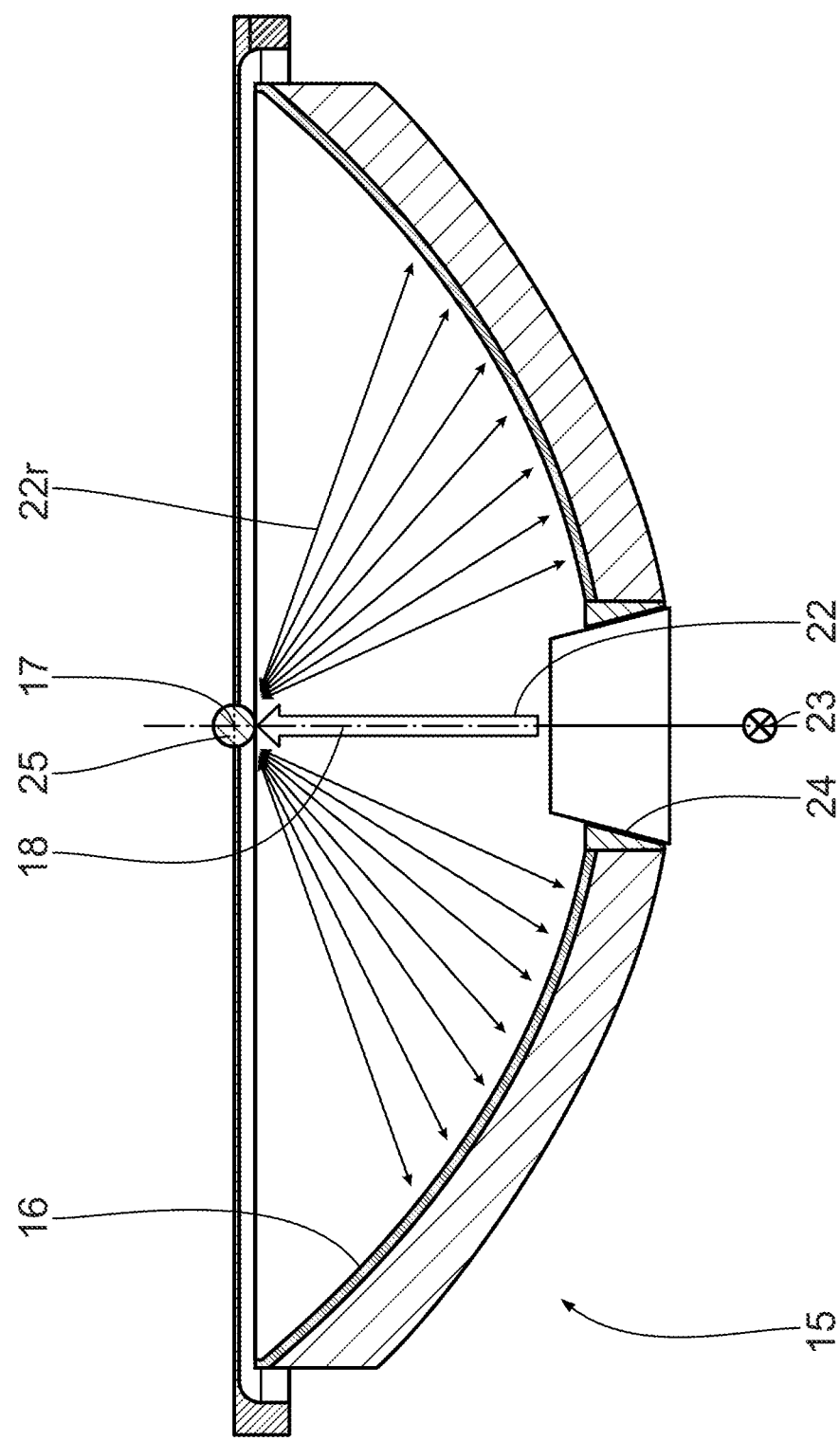
FIG. 2 in a meridional section an EUV collector mirror including a light path of pump light coming from a pump light source.

FIG. 2 shows a meridional section of an EUV collector mirror 15 which is part of the light source module 2, in a meridional section. A reflection surface 16 of the EUV collector mirror 15 serves to reflect the illumination light which is not shown in FIG. 2 impinging on the reflection surface 16 from a source region 17 to the subsequent EUV illumination optical unit 6. To this end, the reflection surface 16 has an ellipsoidal shape which is rotationally symmetric with respect to an optical axis 18. The source region 17 is arranged in one focal region of the ellipsoidal shape of the reflection surface 16. An intermediate focus not shown in FIG. 2 which serves to discriminate the usable EUV illumination light 3 from other wavelengths and also from debris is located at the other focal point of this ellipsoidal shape.

Figure 3:
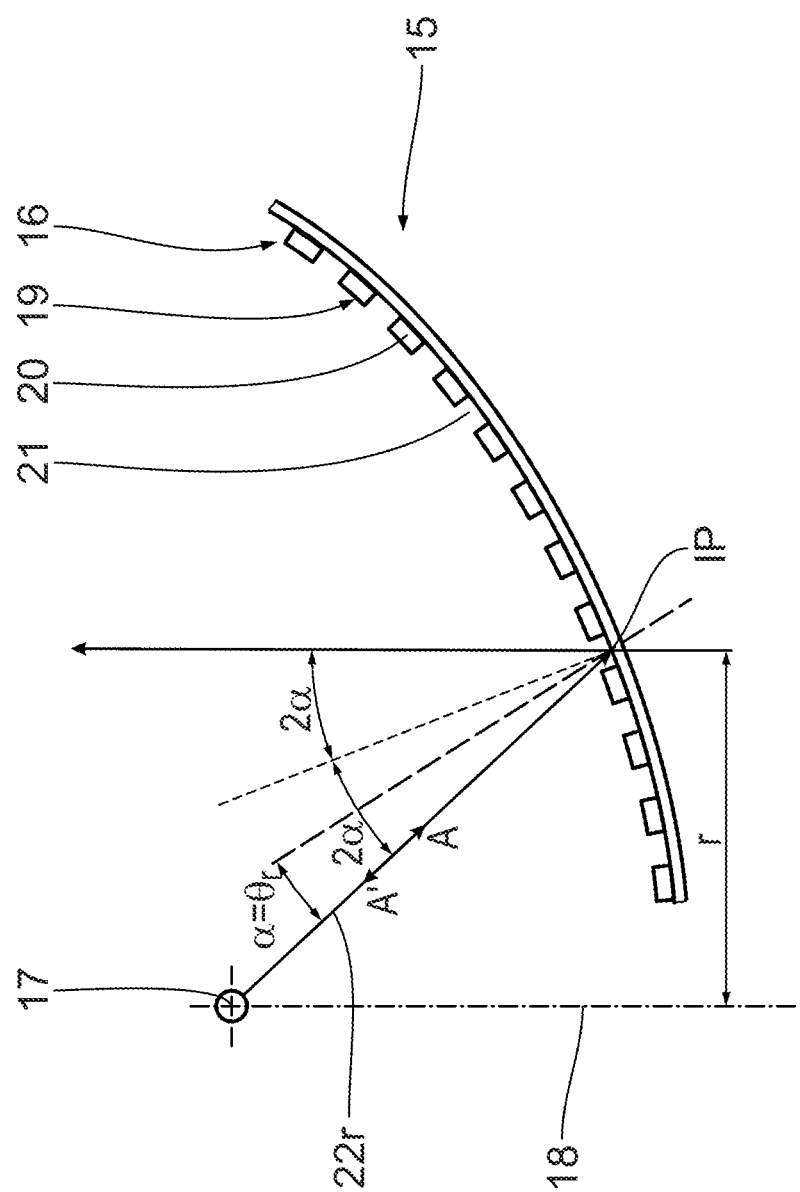
FIG. 3 schematically a magnified section of a reflection surface showing a pump light grating structure configured to retroreflect pump light impinging upon the pump light grating structure from a source region back to this source region, wherein a retroreflected pump light ray path for a $+1^{st}$ order of diffraction and also for a $-1^{st}$ order of diffraction is shown.

FIG. 3 shows a magnified section of the reflection surface 16 of the EUV collector mirror 15. Schematically shown in this magnified view is a pump light grating structure 19 including periodically alternating positive structures 20 ("mountains") and negative structures 21 ("valleys"). Such periodicity of the grating structure 19 is characterized by a grating pitch p.

The pump light grating structure 19 is configured to retroreflect pump light 22 (compare also FIG. 2) impinging upon the pump light grating structure 19 from the source region 17 back to the source region.

The pump light 22 is emitted from a pump light source 23 as shown schematically in FIG. 2. The pump light source 23 is a $CO_2$ laser source producing pump light having a wavelength around 10 µm, e.g. a pump light wavelength of 10.6 µm. Alternatively, the pump light source 23 may be a Nd based solid state laser source, e.g. a Nd:YAG laser producing a pump light wavelength around 1 µm, e.g. a pump light wavelength of 1.064 µm. The wavelength of the pump light 22 deviates from the wavelength of the illumination light 3, i.e. from the wavelength of the usable EUV light.

The pump light 22 is pulsed. The pump light source 23 is a MOPA (master oscillator power amplifier) laser source.

The collimated pump light 22 passes through a through hole 24 arranged in the reflection surface 16 of the EUV collector mirror 15 and impinges on a tin droplet 25 arranged in the source region 17 to produce the illumination light 3 not shown in FIG. 2. The light path of the pump light 22 from the pump light source 23 to the source region 17 is collinear with the optical axis 18 of the reflection surface 16 of the EUV collector mirror 15.

The tin droplet 25 has a spherical shape, i.e. has no pancake shape when being impinged upon by the pump light 22.

Part of the pump light 22 impinging upon the tin droplet 25 is absorbed by the tin droplet 25. Another part of the impinging pump light 22 is reflected from the tin droplet 25. Beam paths of such reflected pump light 22 are exemplified shown as pump light rays $22_r$ in FIG. 2. Due to the spherical shape of the tin droplet 25, the reflected pump light rays $22_r$ impinge upon the reflection surface 16 over a wide area thereof which carries the pump light grating structure 19 as schematically shown in FIG. 3.

FIG. 3 also shows schematically the retroreflecting conditions of one exemplified reflected pump light rays $22_r$. Such pump light ray $22_r$ impinges upon the reflection surface 16 with an angle of incidence α which is also denoted as $θ_r$. Such angle of incidence $θ_r$ depends upon the radial distance of an impingement point IP of the pump light ray $22_r$ on the reflection surface 16 from the optical axis 18. Such distance between the impingement point IP and the optical axis 18 in FIG. 3 is denoted as r.

The pitch p of the pump light grating structure 19 varies over the reflection surface 16 depending on the distance r of the respective positive and negative structures 20/21 to the optical axis according to the following equation:

$$p(r) = \lambda_{PL}/2 \sin(θ_r)$$

Here p(r) denotes the pitch of the pump light grating structure 19 dependent on the distance r between the respective impingement point IP and the optical axis 18;

$\lambda_{PL}$ denotes the wavelength of the pump light 19;

$θ_r$ denotes the angle of incidence of the respective pump light ray $22_r$ on the reflection surface 16, i.e. the angle between the incoming pump light ray $22_r$ on the one hand and a normal to a section of a main surface of the reflection surface 16 around the respective impingement point IP.

A small angle of incidence $θ_r$ according to the above equation leads to a larger pitch p and, vice versa, a large angle of incidence $θ_r$ leads to a smaller pitch p. Depending on the incidence geometry, i.e. depending on the arrangement of the reflection surface 16, its curvature and the position of the source region, this leads to the following variants regarding the dependency of the pitch from the distance r of the respective rating structures 20/21 to the optical axis 18:

The variation of the pitch p may be such that the pitch increases with increasing distance r;

the variation of the pitch p may be such that the pitch decreases with increasing distance r;

the pitch p may depend non-monotonically on the distance r.

The pitch of the pump light grating structure 19 satisfies for the $+1^{st}$ order of diffraction the retroreflecting condition for each of the pump light rays $22_r$. Consequently, all of the pump light rays $22_r$ impinging on the pump light grating structure 19 on the reflection surface 16 of the EUV collector mirror 15 are retroreflected as shown in FIG. 2 and, exemplified for one of the pump light rays $22_r$ also in FIG. 3.

In addition, FIG. 3 also shows a diffracted beam of the $-1^{st}$ order of diffraction.

The pump light grating structure 19 is blazed for the $+1^{st}$ order of reflection of the pump light ray $22_r$ which is not shown in FIG. 3. Thus, the $+1^{st}$ order of diffraction carries almost all of the energy of the incoming pump light ray $22_r$.

The retroreflected pump light rays $22_r$ again impinge upon the tin droplet 25 increasing therefore the pumping efficiency of the light source module 2.

The individual pulses of the pump light 19 have a pulse duration (full width half max) below 50 ns, preferably below 40 ns, preferably below 30 ns, preferably below 20 ns, preferably below 10 ns, preferably below 8 ns, preferably below 5 ns.

In particular, a rise time of the pump light pulse between a low light level which is less than 10% of the maximum pulse intensity and a high light level which is more than 80% of the maximal pulse intensity is below 15 ns, below 10 ns, or even below 5 ns. Such short pulse duration and/or such small rise time leads to a good conversion efficiency from the pump light energy into the energy of the usable EUV illumination light 3.

The pump light grating structure 19 has a reflectivity for the pump light 22 which is larger than 50%. In particular, such reflectivity is in the range between 50% and 90% and can be in the range between 60% and 85% or in the range between 65% and 75%.

By interaction of the pump light 19 with the tin droplet 25, the usable EUV illumination light 3 is produced having a wavelength of e.g. 6.5 nm or 13 nm.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the structured component, is produced by developing the light-sensitive layer.

What is claimed is:

1. Collector mirror configured for extreme ultraviolet (EUV) light, comprising:
   a reflection surface to reflect usable EUV light which impinges on the reflection surface from a source region to a subsequent EUV optics,
   wherein the reflection surface carries a pump light grating structure configured to retroreflect pump light which impinges upon the pump light grating structure from the source region back to the source region, the pump light having a wavelength ($\lambda_{PL}$) deviating from the wavelength of the usable EUV light, and
   wherein a pitch of the pump light grating structure varies over the reflection surface of the EUV collector mirror.

2. Collector mirror according to claim 1, wherein the pump light grating structure is configured for pump light having a wavelength ($\lambda_{PL}$) around 10 μm.

3. Collector mirror according to claim 1, wherein the pump light grating structure is configured for pump light having a wavelength ($\lambda_{PL}$) around 1 μm.

4. Collector mirror according to claim 1, wherein a grating pitch p(r) of the pump light grating structure complies with:

$$p(r) = \lambda_{PL}/2 \sin(\theta_r),$$

where:
p(r) denotes the pitch of the pump light grating structure dependent on a distance r between a respective impingement point on the reflection surface and a rotational axis of symmetry of the reflection surface;
$\lambda_{PL}$ denotes a wavelength of the pump light; and
$\theta_r$ denotes an angle of incidence of a respective pump light ray on the reflection surface.

5. Collector mirror according to claim 1, wherein the pump light grating structure has a reflectivity for the pump light which is between 50% and 90%.

6. Source collector module, comprising:
a pump light source to produce pump light,
a collector mirror according to claim 1.

7. Source collector module according to claim 6, wherein the pump light source is configured to produce pump light pulses having a pulse duration below 50 ns.

8. Source collector module according to claim 6, wherein the pump light source is configured to produce pump light pulses having a pulse rise time which is below 5 ns.

9. Illumination optics for an EUV projection exposure apparatus, comprising an EUV collector mirror according to claim 1.

10. Projection exposure apparatus, comprising:
an illumination optics according to claim 9 for guiding the usable EUV illumination light from the EUV collector mirror towards an object field in an object plane, in which an object to be imaged is arranged,
a projection optical unit for imaging the object field into an image field in which a substrate is arranged,
holders for holding, respectively, the object to be imaged and the substrate.

11. A method for producing a structured component, comprising:
providing a reticle and a wafer,
projecting a structure on the reticle onto a light-sensitive layer of the wafer with a projection exposure apparatus as claimed in claim 10, and
producing a microstructure and/or a nanostructure on the wafer.

12. A structured component, produced according to a method as claimed in claim 11.

* * * * *

UNITED STATES PATENT AND TRADEMARK OFFICE
CERTIFICATE OF CORRECTION

| | |
|---|---|
| PATENT NO. | : 12,276,815 B2 |
| APPLICATION NO. | : 17/722028 |
| DATED | : April 15, 2025 |
| INVENTOR(S) | : Van De Kerkhof |

Page 1 of 1

It is certified that error appears in the above-identified patent and that said Letters Patent is hereby corrected as shown below:

In the Specification

Column 1, Line 67, delete "rreflection" and insert -- reflection --.

Signed and Sealed this
Twenty-ninth Day of July, 2025

Coke Morgan Stewart
*Acting Director of the United States Patent and Trademark Office*